US009256250B2

(12) United States Patent
Raff et al.

(10) Patent No.: US 9,256,250 B2
(45) Date of Patent: Feb. 9, 2016

(54) ELECTRONIC DEVICES WITH FLEXIBLE DISPLAYS HAVING FASTENED BENT EDGES

(71) Applicant: Apple Inc., Cupertino, CA (US)

(72) Inventors: John Raff, Menlo Park, CA (US); Scott A. Myers, San Francisco, CA (US); Christopher Stringer, Woodside, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/247,124

(22) Filed: Apr. 7, 2014

(65) Prior Publication Data

US 2014/0218856 A1 Aug. 7, 2014

Related U.S. Application Data

(63) Continuation of application No. 13/452,061, filed on Apr. 20, 2012, now Pat. No. 8,724,304.

(51) Int. Cl.
*G06F 1/16* (2006.01)
*G06F 1/00* (2006.01)
*H04L 1/00* (2006.01)

(52) U.S. Cl.
CPC ............... *G06F 1/1601* (2013.01); *G06F 1/00* (2013.01); *G06F 1/1637* (2013.01); *H04L 1/00* (2013.01); *Y10T 29/49002* (2015.01)

(58) Field of Classification Search
USPC ............. 362/613, 249.04, 602, 612; 313/512, 313/498, 504; 345/697, 173, 12, 212, 690, 345/87, 100, 207; 455/556.1, 553.1, 575.8, 455/412, 566, 545, 575.1, 575.3, 412.1, 455/67.7, 573, 557; 361/679.01, 679.21, 361/679.22, 679.23, 679.24, 679.27, 679.3, 361/679.55, 679.56, 679.41
See application file for complete search history.

(56) References Cited

U.S. PATENT DOCUMENTS 4,066,855 A 1/1978 Zenk
4,085,302 A 4/1978 Zenk et al.
(Continued)

FOREIGN PATENT DOCUMENTS

JP 2000163031 6/2000
JP 2002342033 11/2002

OTHER PUBLICATIONS

Martisauskas et al., U.S. Appl. No. 13/229,120, filed Sep 9, 2011.
(Continued)

*Primary Examiner* — Hung Duong
(74) *Attorney, Agent, or Firm* — Treyz Law Group; Kendall P. Woodruff

(57) ABSTRACT

An electronic device may be provided with a display having a flexible substrate with fastened bent edges. The flexible substrate may have an active region that includes an array of light-emitting elements such as organic light-emitting diodes. The flexible substrate may also have inactive regions that lie outside of the active region. The bent edges may include portions of the inactive regions and portions of the active region. The bent edges may be wrapped to conform to the shape of an internal support structure. The bent edges may be fastened to the support structure with fastening members that attach a housing member or an internal clamp to the support structure. The bent edges may be secured between the housing member or the internal clamp and the support structure. The fastening members may be engaged in openings in the support structure and may pass through or alongside the bent edges.

19 Claims, 11 Drawing Sheets

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 6,803,245 B2 | 10/2004 | Auch et al. | |
| 7,015,894 B2 | 3/2006 | Morohoshi | |
| 7,034,913 B2 | 4/2006 | Ishida | |
| 7,184,064 B2 | 2/2007 | Zimmerman et al. | |
| 7,541,671 B2 | 6/2009 | Foust et al. | |
| 7,663,607 B2 | 2/2010 | Hotelling et al. | |
| 7,834,451 B2 | 11/2010 | Lee et al. | |
| 8,690,412 B2 * | 4/2014 | Franklin et al. | 362/613 |
| 8,716,932 B2 * | 5/2014 | Rappoport et al. | 313/512 |
| 2003/0048256 A1 | 3/2003 | Salmon | |
| 2006/0026521 A1 | 2/2006 | Hotelling et al. | |
| 2006/0197753 A1 | 9/2006 | Hotelling | |
| 2009/0167171 A1 | 7/2009 | Jung et al. | |
| 2009/0256471 A1 | 10/2009 | Kim et al. | |
| 2010/0026952 A1 | 2/2010 | Miura et al. | |
| 2010/0315399 A1 | 12/2010 | Jacobson et al. | |
| 2011/0086680 A1 | 4/2011 | Kim et al. | |
| 2012/0127087 A1 | 5/2012 | Ma | |
| 2012/0146886 A1 | 6/2012 | Minami et al. | |
| 2012/0218219 A1 | 8/2012 | Rappoport et al. | |
| 2012/0243151 A1 * | 9/2012 | Lynch | 361/679.01 |
| 2012/0249891 A1 | 10/2012 | Sato et al. | |
| 2013/0148315 A1 | 6/2013 | Dabov | |
| 2014/0092338 A1 | 4/2014 | Miyazaki et al. | |
| 2014/0197380 A1 * | 7/2014 | Sung et al. | 257/40 |

OTHER PUBLICATIONS

Myers et al., U.S. Appl. No. 13/108,256, filed May 16, 2011.
Rothkopf et al., U.S. Appl. No. 13/171,295, filed Jun. 28, 2011.
Rothkopf et al., U.S. Appl. No. 13/177,165, filed Jul. 6, 2011.
Lynch, U.S. Appl. No. 13/184,303, filed Jul. 15, 2011.
Chen et al., U.S. Appl. No. 13/186,238, filed Jul. 19, 2011.
Myers et al., U.S. Appl. No. 13/246,510, filed Sep. 27, 2011.
Rappoport et al., U.S. Appl. No. 13/249,734, filed Sep. 30, 2011.
Franklin et al., U.S. Appl. No. 13/250,227, filed Sep. 30, 2011.
Franklin et al., U.S. Appl. No. 13/250,666, filed Sep. 30, 2011.
Drzaic et al., U.S. Appl. No. 13/252,971, filed Oct. 4, 2011.
Rappoport et al., U.S. Appl. No. 13/273,851, filed Oct. 14, 2011.
Franklin et al., U.S. Appl. No. 13/310,409, filed Dec. 2, 2011.
Franklin et al., U.S. Appl. No. 13/422,724, filed Mar. 16, 2012.
Raff et al., U.S. Appl. No. 13/452,061, filed Apr. 20, 2012.

* cited by examiner

ELECTRONIC DEVICES WITH FLEXIBLE DISPLAYS HAVING FASTENED BENT EDGES

This application is a continuation of U.S. patent application Ser. No. 13/452,061, filed Apr. 20, 2012, which is hereby incorporated by reference herein in its entirety. This application claims the benefit of and claims priority to U.S. patent application Ser. No. 13/452,061, filed Apr. 20, 2012.

BACKGROUND

This relates generally to electronic devices, and more particularly, to displays for electronic devices.

Electronic devices such as portable computers and cellular telephones are often provided with rigid displays made from rigid display structures. Rigid display structures often include a significant amount of inactive border area for around the display for accommodating display circuitry for operating display pixels in an active region of the display. It is not uncommon for the width of the inactive border to be up to a centimeter wide or more. This type of wide inactive region tends to make displays bulky and requires the use of electronic device housings with wide bezels.

Flexible display technologies are available that allow displays to be flexed. In a typical flexible display, an array of light-emitting diodes such as organic light-emitting diodes may form a planar active display region on a flexible substrate. Inactive edge portions of the flexible substrate are sometimes bent away from the plane of the active region. However, a flexible substrate with bent edges can have a tendency to return to its original flat shape. This tendency can cause a bent portion to become separated from a mounting structure to which it is adhered or to exert an undesired force on another component or structure in the electronic device.

It would therefore be desirable to be able to minimize the width of the inactive region in a display and to otherwise improve displays for electronic devices.

SUMMARY

An electronic device may be provided that has a display such as a flexible display. Flexible displays may include organic light-emitting diode (OLED) displays. OLED displays contain display pixels that can produce illumination without using a separate backlight unit.

A flexible display may include a flexible light-emitting diode layer with bent edges. The flexible light-emitting diode layer may include a flexible sheet of polymer or other flexible substrate. An array of light-emitting diodes such as organic light-emitting diodes may form a planar active region on the flexible substrate.

The flexible display may be mounted to a rigid support structure such as a mandrel. The mandrel may be formed from aluminum, copper, plastic, glass, or other suitable rigid materials or combinations of materials.

The bent edges of the flexible display may be wrapped around an edge of the mandrel. The bent edges of the flexible display may be fastened to the mandrel in a bent position using a mounting structure that is attached to the mandrel. The bent edges of the display may be interposed between the mounting structure and the mandrel.

The mounting structure may be formed from aluminum, copper, plastic, glass, or other suitable rigid materials. The mounting structure may include a portion of a housing for the device or may be a standalone structure such as an internal clamping member. The mounting structure may be attached to the mandrel using screws, clips, adhesive or any other suitable fastening member so that the bent edges of the flexible display are secured between the mandrel and the mounting structure.

Further features of the invention, its nature and various advantages will be more apparent from the accompanying drawings and the following detailed description.

DETAILED DESCRIPTION

Electronic devices may include displays. Displays may be used to display visual information such as text and images to users. Displays such as flexible displays may include organic light-emitting diode (OLED) displays.

A flexible display may include a flexible organic light-emitting diode layer with bent edges. The bent edges of the display may be fastened to a support structure in the electronic device. The bent edges of the display may include active display pixels or may be devoid of active display pixels. The bent edges may include circuitry for routing signals to the active display pixels in the bent edges or in other active display portions of the display.

Figure 1:
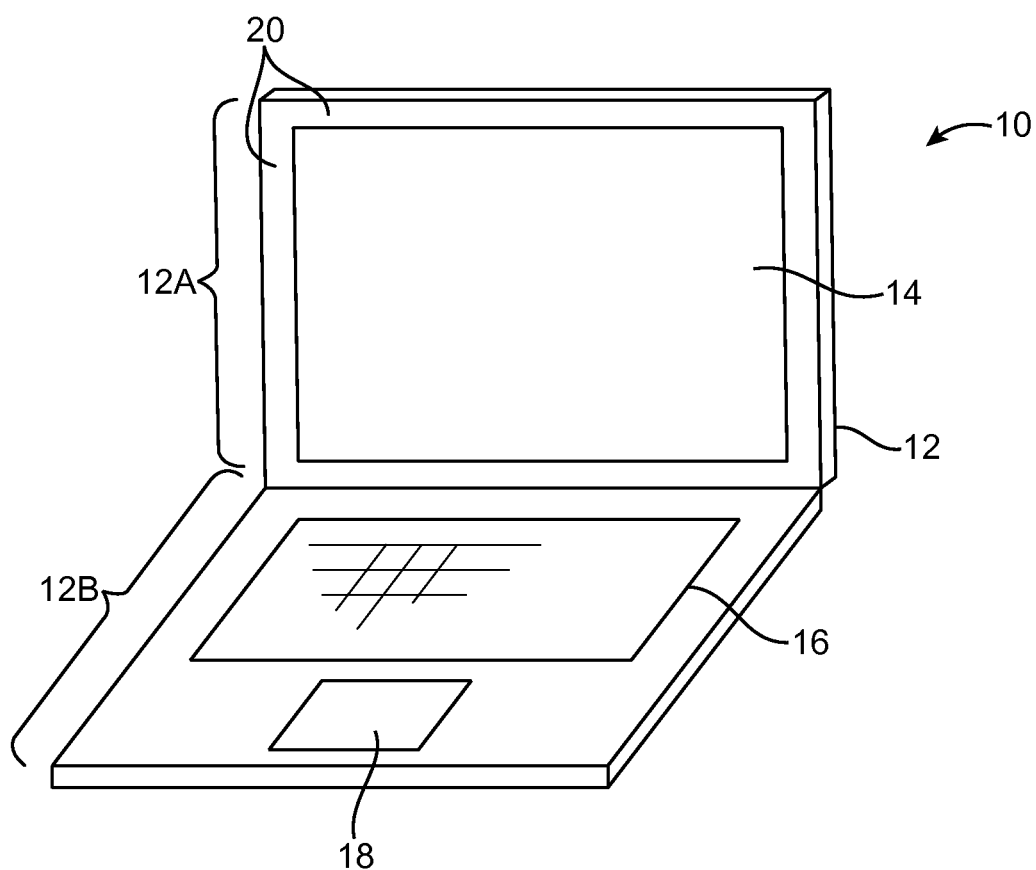
FIG. 1 is a perspective view of an illustrative electronic device such as a laptop computer with a display in accordance with an embodiment of the present invention.
Figure 2:
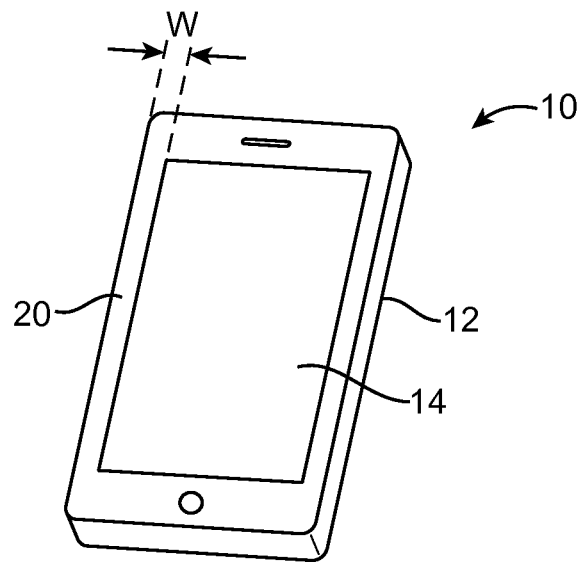
FIG. 2 is a perspective view of an illustrative electronic device such as a handheld electronic device with a display in accordance with an embodiment of the present invention.
Figure 3:
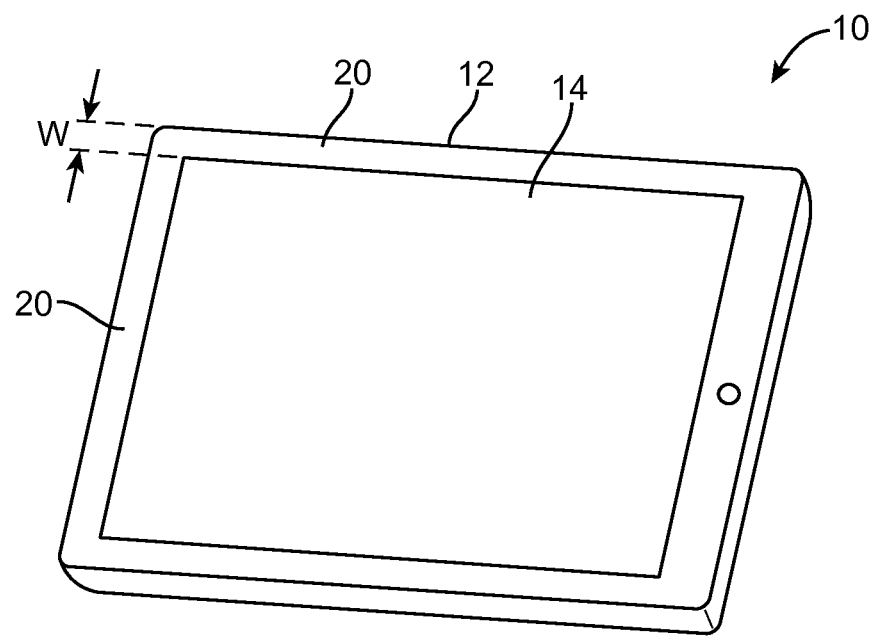
FIG. 3 is a perspective view of an illustrative electronic device such as a tablet computer with a display in accordance with an embodiment of the present invention.

Illustrative electronic devices that may be provided with displays are shown in FIGS. 1, 2, and 3. FIG. 1 shows how electronic device 10 may have the shape of a laptop computer having upper housing 12A and lower housing 12B with components such as keyboard 16 and touchpad 18.

FIG. 2 shows how electronic device 10 may be a handheld device such as a cellular telephone, music player, gaming device, navigation unit, or other compact device.

FIG. 3 shows how electronic device 10 may be a tablet computer. However, the examples of FIGS. 1, 2, and 3 are merely illustrative examples. Electronic devices such as illustrative electronic device 10 of FIGS. 1, 2, and 3 may be laptop computers, computer monitors with embedded computers, tablet computers, cellular telephones, media players, other handheld and portable electronic devices, smaller devices such as wrist-watch devices, pendant devices, headphone and earpiece devices, other wearable and miniature devices, or other electronic equipment.

Device 10 may have a housing enclosure such as housing 12. Housing 12, which is sometimes referred to as a case or enclosure, may be formed of materials such as plastic, glass, ceramics, carbon-fiber composites and other composites, metal, aluminum, other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Device 10 may have one or more displays such as display 14. Display 14 may be an organic light-emitting diode (OLED) display or other suitable display. Display layer 14 may include display pixels formed from light-emitting diodes (LEDs), organic LEDs (OLEDs), plasma cells, electronic ink elements, liquid crystal display (LCD) components, or other suitable display pixel structures compatible with flexible displays. Display 14 may, if desired, include capacitive touch sensor electrodes for a capacitive touch sensor array or other touch sensor structures (i.e., display 14 may be a touch screen). Touch sensor electrodes may be provided on a touch panel layer that is interposed between an organic light-emitting diode display layer and a transparent cover layer (e.g., a cover glass layer), may be formed on the underside of a cover layer, or may otherwise be incorporated into display 14.

The display (sometimes referred to as the display layer, the OLED display, the flexible display or flexible OLED display) may have a planar rectangular active region in its center. The edges of the organic light-emitting diode display surround the active center region and form a rectangular peripheral ring. This border region may contain circuitry that does not emit light and is therefore referred to as the inactive portion of the display. The inactive portion of the display is shown as inactive border region 20 in FIGS. 1, 2, and 3.

To enhance device aesthetics, the width of inactive border region 20 that is visible from the front of the display may be minimized by bending portions of the flexible display downwards at an angle away from the planar central region into the device (e.g., along the boundary between the active region and the inactive region). For example, the edges of the flexible display may be folded (wrapped) so that they lie perpendicular to the plane of the active region or so that they lie partially underneath the plane of the active region.

When this type of arrangement is used, the width W of inactive border regions 20 of devices 10 of FIGS. 1, 2, and 3 that is visible from the front of display 14 is minimized. Any minimal edge portion of display 14 that remains visible may be covered with a bezel or a portion of a display cover layer that is coated on its underside with an opaque masking layer such as black ink (as examples). A bezel may be formed, for example, from a stand-alone bezel structure that is mounted to housing 12, from a portion of housing 12 (e.g., a portion of the sidewalls of housing 12), or using other suitable structures.

If desired, the width of inactive border region 20 that is visible from the front of the display may be further minimized by including a portion of the active region of the display in the bent edges of the flexible display. In this way, active display pixels in the flexible display may be formed across substantially the entire front surface of device 10. When this type of arrangement is used, some of the active display pixels of the flexible display may be covered by a portion of the device housing (e.g., a bezel portion of the device housing) and may not be used for displaying information to a user.

In some situations a portion of the bent edges of the flexible display that contain active display pixels to be used for displaying images to a user of device 10 may be curved away from the inner surface of a cover layer such as a cover glass layer. In this type of arrangement, the cover glass layer may be provided with lensing capabilities (e.g., by attaching lenses to the cover glass layer or by forming lenses in the cover glass layer) to correct for optical distortions that may be caused by the separation between the active display pixels and the cover glass layer.

Figure 4:
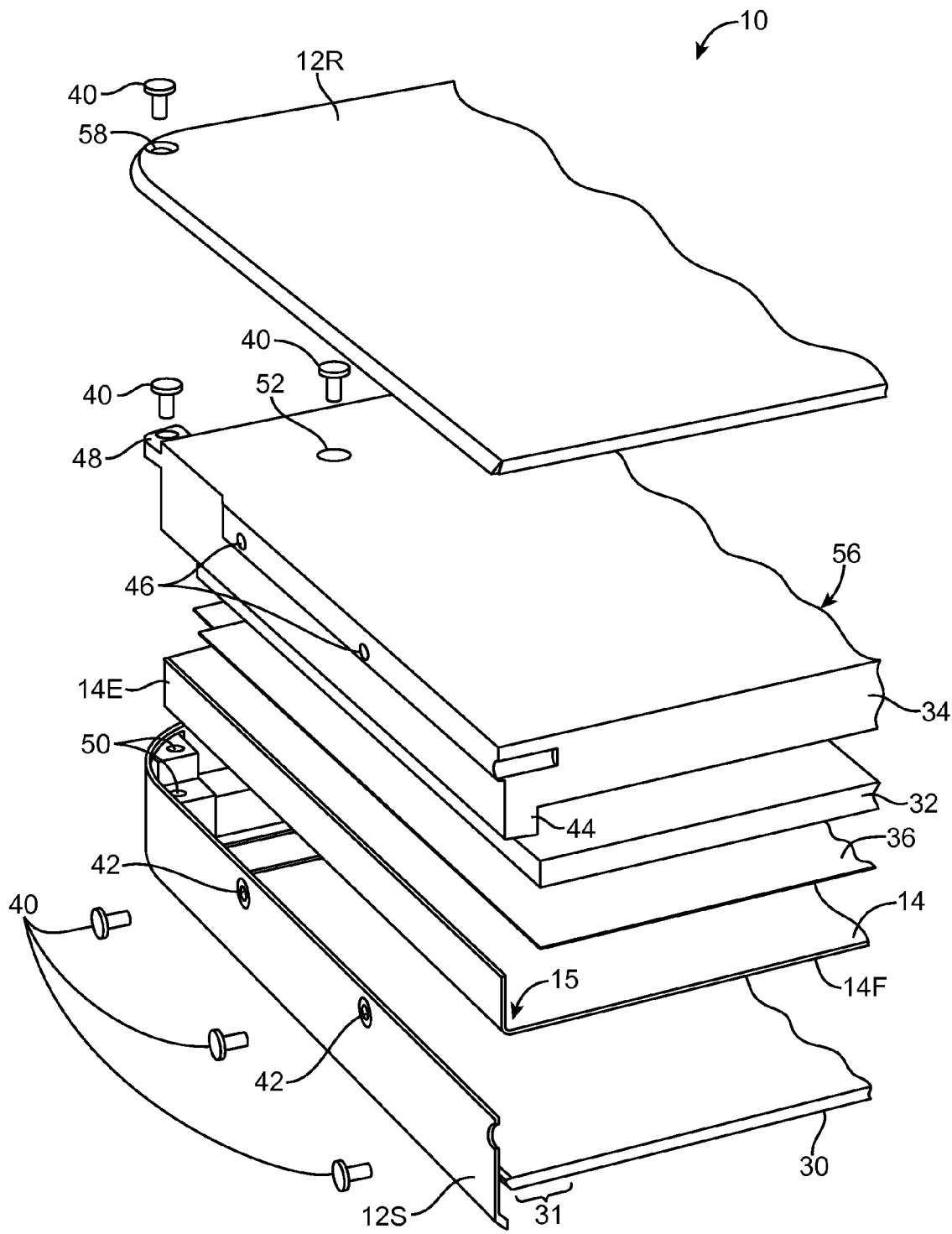
FIG. 4 is an exploded perspective view of illustrative structures including a carrier structure and a support structure for fastening bent edges of a flexible display to the support structure using a portion of a device housing in accordance with an embodiment of the present invention.

An exploded perspective view of an illustrative electronic device having a flexible display with fastened bent edges is shown in FIG. 4. As shown in FIG. 4, device 10 may include a flexible display 14 with first and second portions 14F and 14E that are separated by a bend such as bend 15. Bent portion 14E (sometimes referred to as edge portion, or bent edge portion) may be perpendicular to a planar front portion such as front portion 14F of display 14. However, this is merely illustrative. Bent portion 14E may be formed at any suitable angle with respect to front portion 14F, front portion 14F may be substantially non-planar, or bent portion 14E may be a continuously curved portion that is wrapped around a rounded end of a support structure.

Front portion 14F may be attached to a rigid carrier structure such as carrier structure 32 using an adhesive layer such as layer 36. Adhesive layer 36 may be formed from a pressure-sensitive adhesive, liquid adhesive, light-cured adhesive, high bond adhesive or other suitable adhesive material. Adhesive layer 36 may be formed on a first (inner) surface of front portion 14F. An opposing (outer) surface of front portion 14F of display 14 may be covered by a cover layer such as cover layer 30. Cover layer 30 may be formed from a rigid or flexible transparent material such as plastic or glass. Cover layer 30 may be substantially planar or may have a concave or convex shape.

Cover layer 30 may be attached to display 14 (e.g. using adhesive) or may be mounted adjacent to display 14 without any attachments to display 14. If desired, cover layer 30 may include a portion such as portion 31 having lensing capabilities for correcting distortions in images generated by display pixels in portions of display 14 that are bent away from cover layer 30.

Cover layer 30 may be attached to a housing member such as housing sidewall member 12S (sometimes referred to as a sidewall member, a sidewall portion, a housing sidewall portion, or a band). Sidewall member 12S may wrap around substantially all of an edge of device 10. If desired, band 12S may include portions that extend onto a front surface of device 10. For example, a portion of band 12S may cover a portion of cover layer 30. Internal components such as antennas, buttons, switches, speakers or other components may be mounted under band 12S. Openings may be provided in band 12S to accommodate internal components.

Cover layer 30 may include a notch or recess for receiving band 12S. Band 12S may be formed from aluminum or any other suitable material. Device 10 may be enclosed by an enclosure formed from band 12S and a rear housing member such as rear cover 12R. Rear cover 12R may be formed from a rigid material such as metal (e.g., aluminum). Carrier structure 32 may be mounted against a support structure such as support structure 34 (sometimes referred to herein as a mandrel). Mandrel 34 may include a protruding portion such as portion 44 that mounted along an edge of carrier structure 32. Portion 44 may be mounted in contact with a display 14. As shown in FIG. 4, portion 44 of mandrel 34 may include a first surface mounted in contact with front portion 14F of display 14 and a second surface mounted in contact with bent edge portion 14E of display 14. Bent edge portion 14E may be bent around an edge of mandrel 34. In an assembled device, bent edge portion 14E may be secured between mandrel 34 and a sidewall portion of band 12S.

Mandrel 34 may include openings 46 configured to receive attachment members 40. Openings 46 may, for example, be threaded screw holes. Attachment members 40 may include screws, clips, or other attachment members configured to be secured in openings 46. Band 12S may include openings such as holes 42. Holes 42 in band 12S may be aligned with holes 46 in mandrel 34. Bent edge portions 14E may be secured in a bent position by securing attachment members 40 in openings 46 through holes 42 and through bent edge portion 14E of display 14. In this way, band 12S and bent edge portion 14E may be fastened to mandrel 34 by biasing band 12S toward mandrel 34 using fastening members 40.

Mandrel 34 may include extended portions 48 having openings. Openings such as holes in extended portions 48 may be aligned with additional openings 50 in band 12S. Attachment members 40 may be used to attach mandrel 34 to housing member 12S. During assembly of device 10, aligning openings in portion 48 with openings 50 in band 12S may help in aligning display 14 with cover layer 30. Openings 50 may, for example, be threaded screw holes or other openings configured to engage with attachment members 40. Extended portions 48 may be used to provide a fixed or adjustable alignment with band 12S.

Mandrel 34 may include openings such as openings 52 for receiving additional attachment members 40. Attachment members 40 may be inserted through openings 52 to secure mandrel 34 to carrier 32. Mandrel 34 may include an internal recess or cavity 56 for mounting internal components of device 10 (e.g., batteries, microprocessors, integrated circuits, speakers, etc.).

Rear housing member 12R may include openings such as holes 58. Holes 58 may be aligned with some of openings 50 in band 12R. Attachment members 40 may be used to attach rear cover 12R to band 12S through holes 58 and openings 50. Openings 58 may include an inner portion that passes through rear housing member 12R and a relatively wider outer portion that extends only partially into member 12R and is configured to receive a portion of attachment member 40. For example, a wider outer portion of openings 50 may receive a screw head of a screw 40 so that member 12R may be provided with a smooth exterior surface.

If desired, openings 42 in band 12S may include an inner portion that passes through band 12S and a relatively wider outer portion that extends only partially into member 12S and is configured to receive a portion of attachment member 40. For example, a wider outer portion of openings 42 may receive a screw head of a screw 40 so that member 12S may be provided with a smooth exterior surface.

Figure 5:
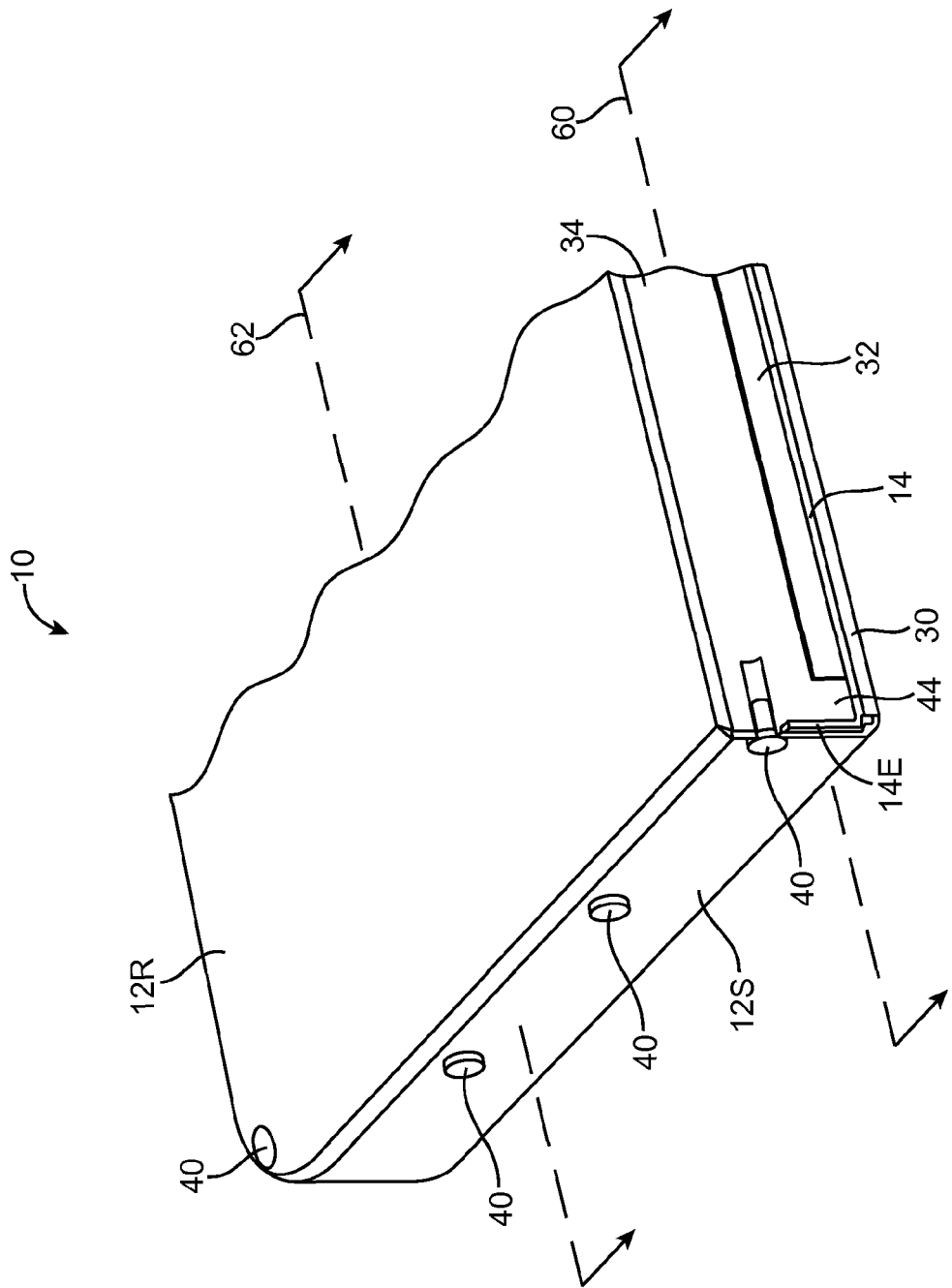
FIG. 5 is a cross-sectional perspective view an illustrative assembled electronic device having a flexible display with fastened bent edges in accordance with an embodiment of the present invention.

As shown FIG. 5, following assembly, the structures of FIG. 4 may be configured to fasten (secure) edge portion 14E between mandrel 34 and band portion 12S of housing 12. Protruding portion 44 of mandrel 34 may be mounted between an edge of carrier 32 and edge portion 14E of display 14. Cross-sectional views of device 10 taken along axes 60 and 62 are shown in FIGS. 6 and 7 respectively.

Figure 6:
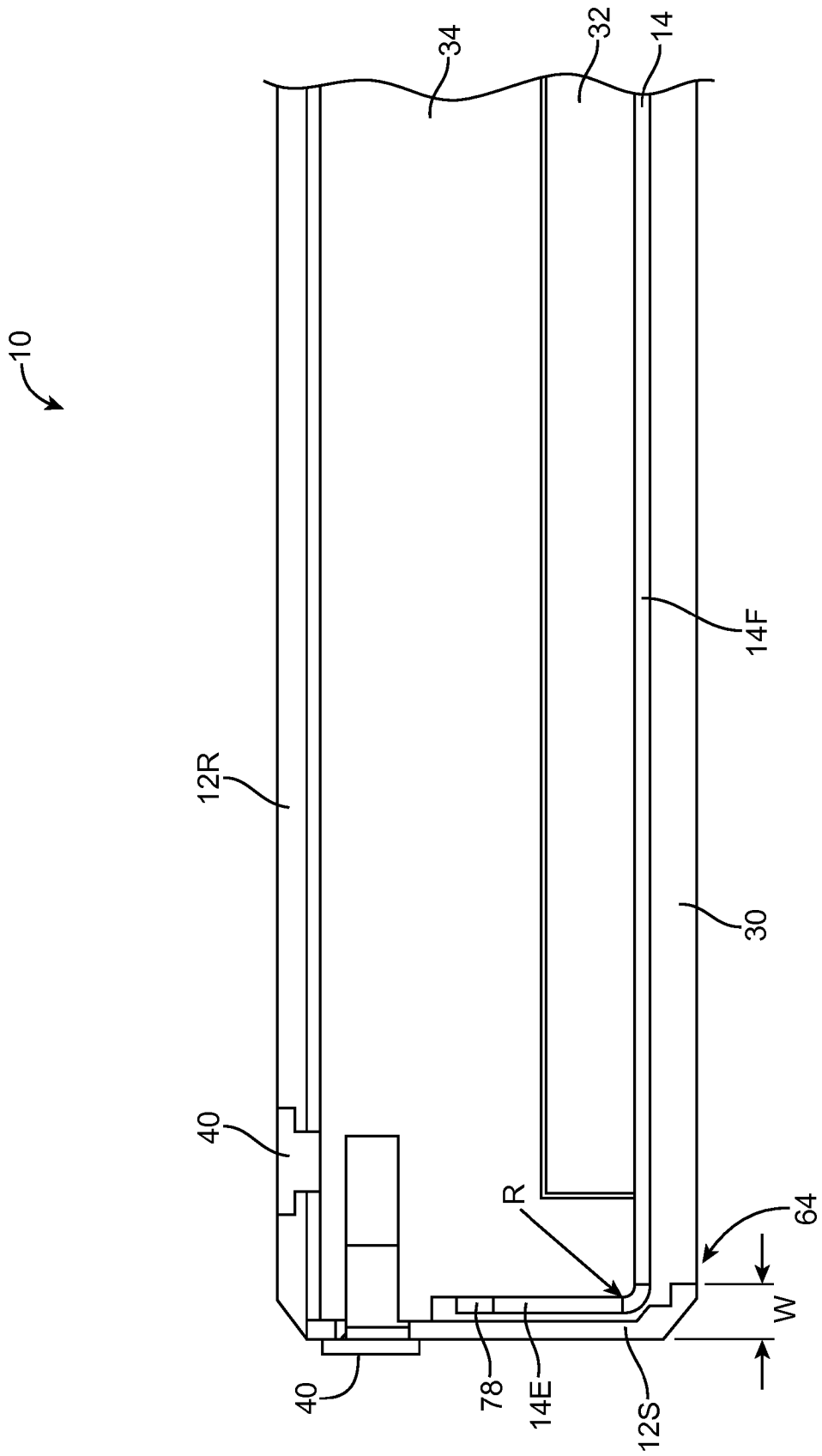
FIG. 6 is a cross-sectional side view of the electronic device of FIG. 5 showing how bent edges of a flexible display may be wrapped around a support structure with a bend radius in accordance with an embodiment of the present invention.
Figure 7:
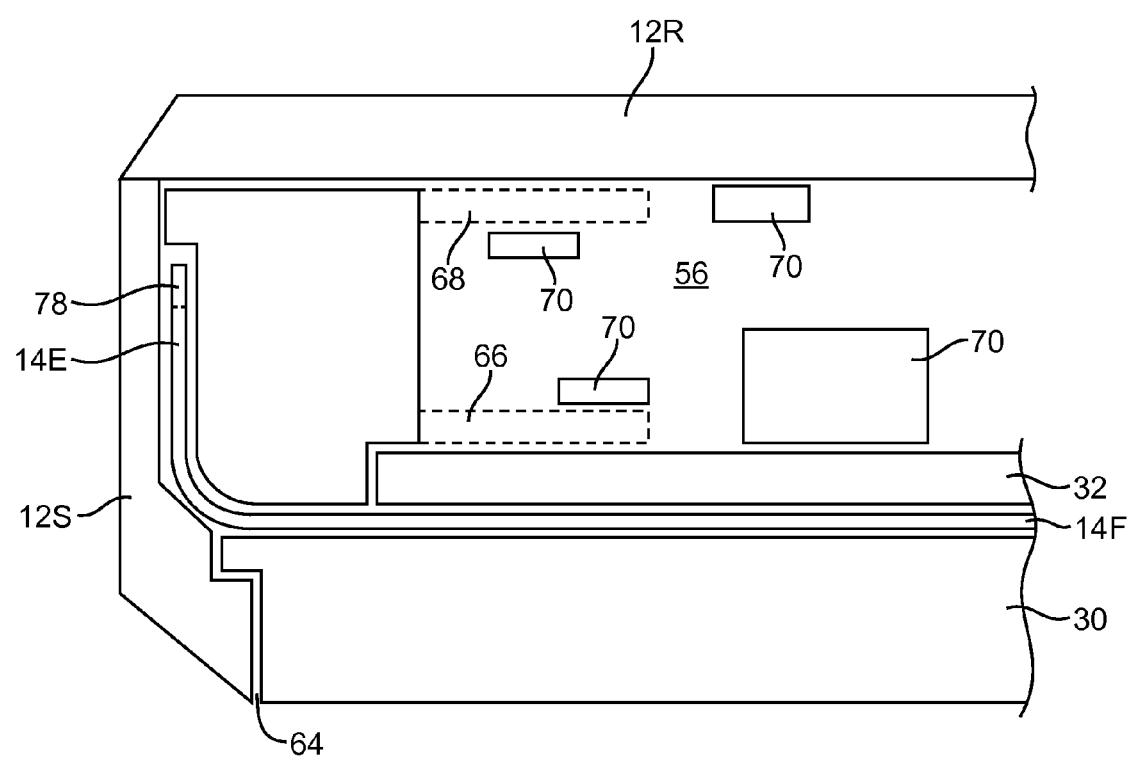
FIG. 7 is a cross-sectional side view of the electronic device of FIG. 5 showing how a support structure such as a mandrel may have a cavity for mounting internal components in accordance with an embodiment of the present invention.

As shown in FIG. 6, in some regions of device 10, mandrel 34 may substantially fill the space within the enclosure formed by portions 12S and 12R of housing 12 between carrier 32 and rear portion 12R. FIG. 6 also shows how bent portion 14E of display 14 may be wrapped around a portion of mandrel 34 having a bend radius R. Bend radius R may, for example, be between 0.3 mm and 0.5 mm, between 0.1 and 0.9 mm, less than 0.4 mm, or greater than or equal to 0.9 mm. The shape of protruding portion 44 of mandrel 34 may be used to provide display 14 with a bend having a bend radius that is equal to the bend radius of portion 44 of mandrel 34. If desired, active display pixels may be formed along substantially all of front portion 14F of display 14 so that the edge portion of device 10 (as viewed from the front) is minimized having a width W. Width W may be determined by the size of engaging portions of cover layer 30 and band portion 12S of housing 12. As examples, width W may be between 1.0 and 1.3 mm, equal to 1.25 mm, less than 1.4 mm, more than 1.4 mm, less than 1.3 mm, less than 1.2 mm or less than 1.0 mm.

Cover layer 30 may include a notch 64 for receiving a corresponding notch in band 12S. Band 12S may be attached to cover layer 30 (e.g., by forming adhesive such as a glue bead between notched portion 64 of cover layer 30 and a corresponding notched portion of band 12S) or band 12S may be abutted against cover layer 30 without any intervening adhesive.

Edge portion 14E of display 14 may include an inactive portion such as portion 78. Inactive portion 78 may be devoid of display pixels. Inactive portion 78 may include circuitry that does not emit light such as conductive routing lines for routing display signals from display control circuitry in device 10 to the display pixels in active display portions of display 14. Inactive portion 78 may include substantially all of bent portion 14E or some parts of bent portion 14E may include active display pixels.

As shown in FIG. 7, in some regions of device 10 (e.g., along axis 62 of FIG. 5), mandrel 34 may be provided with a cavity 56. If desired, cavity 56 in mandrel 34 may extend from carrier 32 to rear housing member 12R or mandrel 34 may include portions such as portion 66 that extend along an inner surface of carrier 32 and portions such as portion 68 that extend along an inner surface of rear housing member 12R. Internal components 70 may be mounted within cavity 56. As examples, internal components 70 may be attached to rear housing member 12R or carrier 32. Internal components 70 may include batteries, microprocessors, speakers, integrated circuits, antennas, compasses, cameras, or other active or inactive components.

Figure 8:
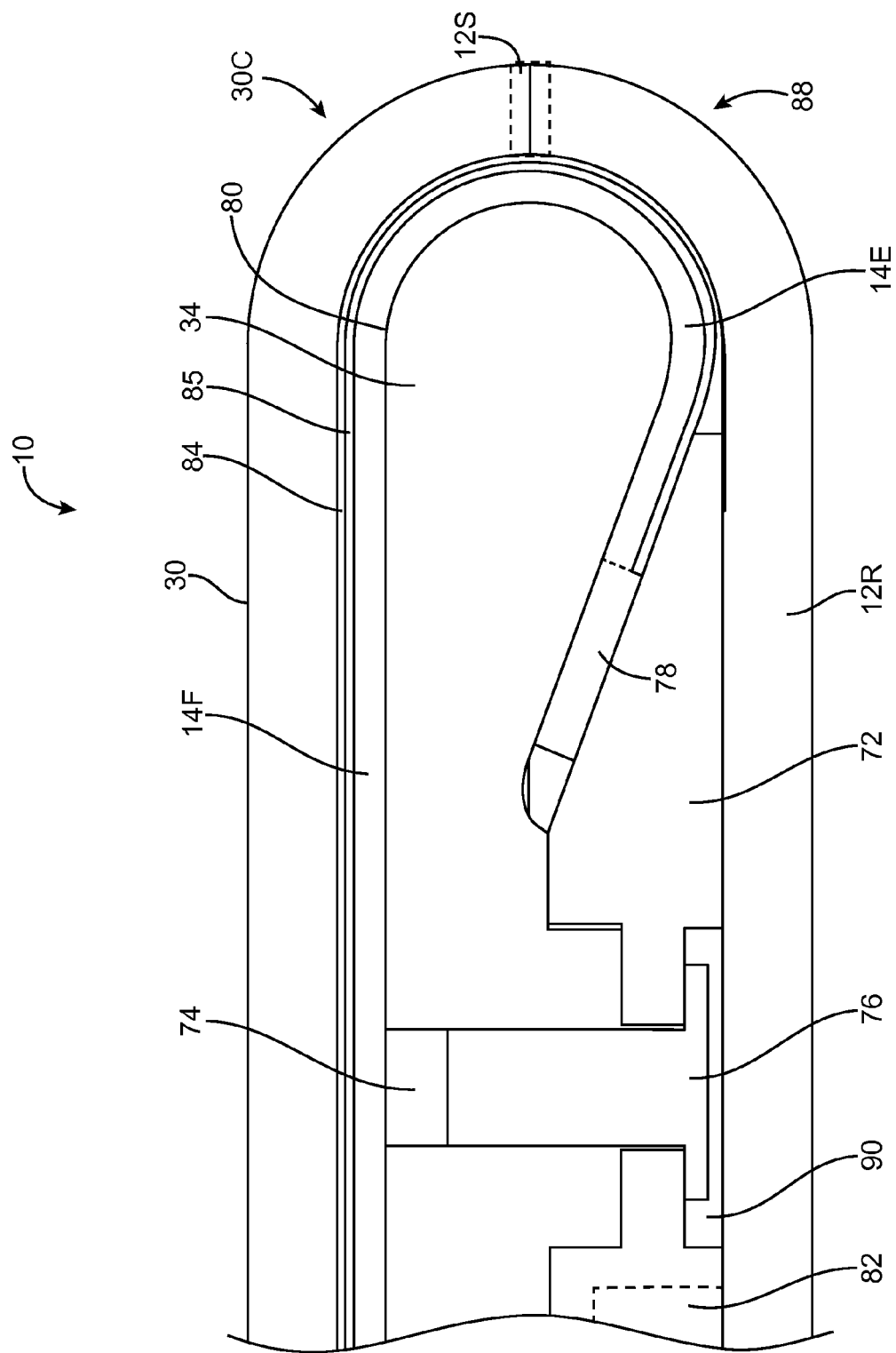
FIG. 8 is a cross-sectional side view of a portion of an illustrative electronic device having a display with bent edges that are fastened to a support structuring using an internal fastening structure in accordance with an embodiment of the present invention.

The configurations of device 10 shown in FIGS. 4, 5, 6, and 7 are merely illustrative. If desired, bent portions of display 14 may be fastened in a bent position using an internal fastening structure such as a clamp as shown in FIG. 8. As shown in FIG. 8, in some configurations, cover layer 30 may have a curved portion such as curved portion 30C. Bent portion 14E of display 14 may be formed along an inner surface of cover layer 30 so that bent portion 14E conforms to the curved shape of curved portion 30C. Rear housing member 12R may include a curved portion 88, if desired. Curved portion 88 of rear housing member may be attached to curved portion 30C of cover layer (e.g., using an adhesive between portions 88 and 30C or by attaching portion 88 and portion 30C to an additional housing member such as sidewall housing member 12S).

In the example of FIG. 8, mandrel 34 includes a rounded edge portion. Bent portion 14E of display 14 may be wrapped around the rounded edge of mandrel 34. If desired, display 14 may be attached to mandrel 34 using an adhesive layer 80. Adhesive layer 80 may include a pressure-sensitive adhesive, a liquid adhesive, a light-cured adhesive, a high bond adhesive or any other suitable adhesive material. If desired, an additional layer of adhesive such as layer 84 may be provided between an outer surface of display 14 and an inner surface of cover layer 30. If desired, a portion of adhesive layer 84 may be formed between curved portion 88 of housing member 12R and the outer surface of display 14.

As shown in FIG. 8, portion 85 of display 14 having display pixels may include front portion 14F and part of bent portion 14E of display 14. Display pixels 85 in bent portion 14E may include active and inactive display pixels. Portion 78 of display 14 may be devoid of active display pixels.

Bent portion 14E of display 14 may be fastened to mandrel 34 using an internal fastening structure such as clamp 72. Clamp 72 may be biased against portion 14E of display 14 by a fastening member 76 (e.g., a screw or a clip) that engages with engaging structures (e.g., threads, protrusions or other engaging structures) in openings 74 in mandrel 34. Clamp 72 may be provided with a recess such as recess 90 for receiving a portion of fastening member 76. For example, recess 90 may be configured to receive a screw head associated with fastening member 76.

If desired, clamp 72 may be provided with a recess such as cavity 82. Internal components such as internal components 70 of FIG. 7 may be mounted within cavity 82.

Figure 9:
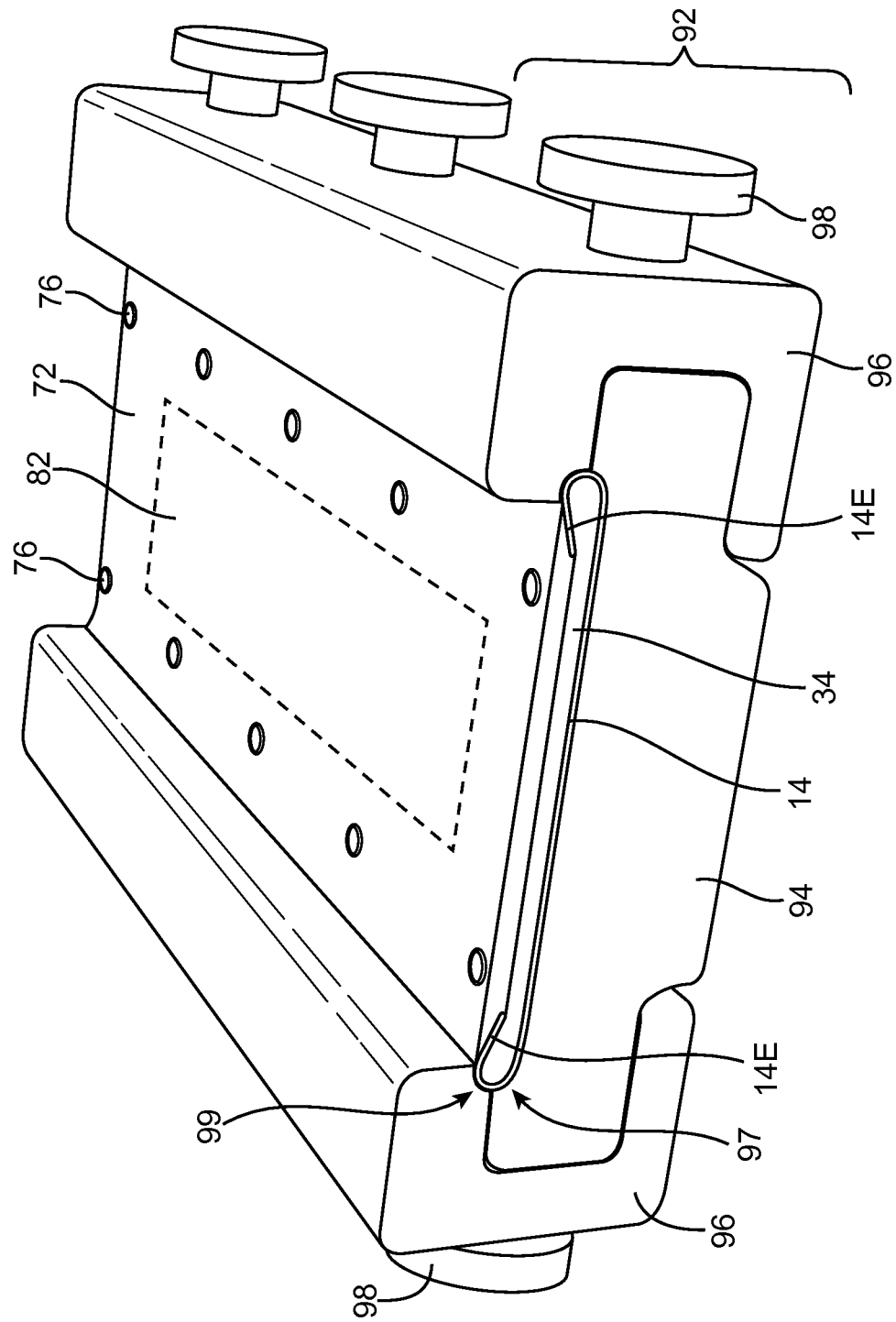
FIG. 9 is a perspective view of illustrative assembly equipment that may be used in fastening the bent edges of a flexible display to a support structure in accordance with an embodiment of the present invention.

Bent portions 14E of display 14 may be fastened to mandrel 34 with clamp 72 using assembly equipment such as assembly equipment 92 of FIG. 9. As shown in FIG. 9, assembly equipment 92 may include a fixed mounting member such as member 94 and one or more movable pushing members 96. Pushing members 96 may include actuating members 98 for moving pushing members 96 against edge portions of display 14. For example, actuating members 98 may be threaded screws that, when turned, provide a lateral force that moves pushing members against display 14.

Fixed mounting member 94 may include curved features such as surface curve 97 having a shape that corresponds to the shape of the rounded edges of mandrel 34. Pushing members 96 may each have curved features such as surface curve 99 with a shape that corresponds to the shape of the rounded edges of mandrel 34. In this way, equipment 92 may be configured to conform edge portions 14E of display 14 to the rounded edges of mandrel 34.

If desired, a cavity for receiving electronic components (e.g., electronic components 70 of FIG. 7) may be formed in region 82 of clamp 72 before or after attaching clamp 72 to support structure (mandrel) 34.

Figure 10:
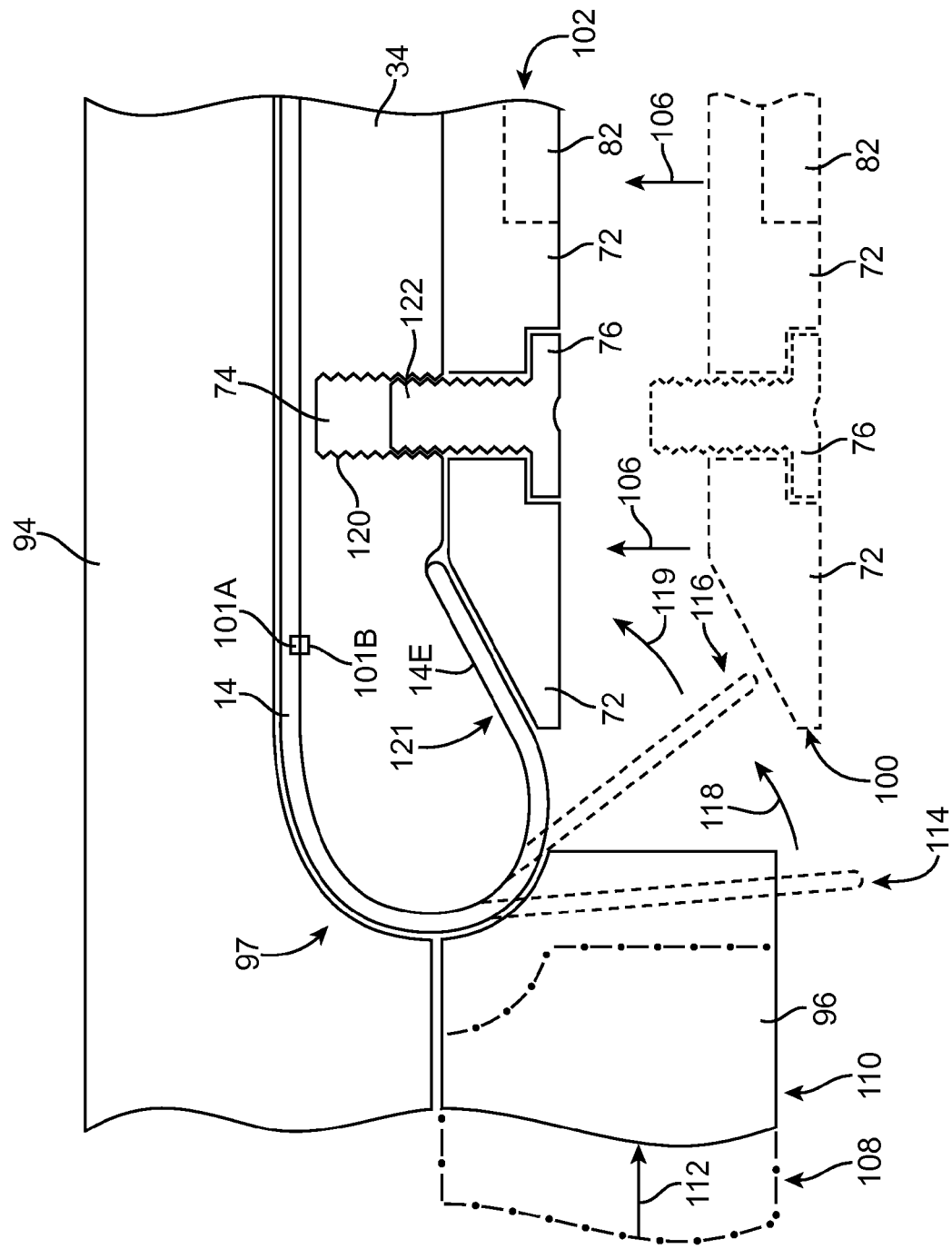
FIG. 10 is a diagram showing how the assembly equipment of FIG. 9 may be moved to fasten the bent edges of a flexible display to a support structure in accordance with an embodiment of the present invention.

FIG. 10 is a diagram showing how assembly equipment 92 may be used to conform and attach edge portions 14E of display 14 around the rounded edges of mandrel 34. As shown in FIG. 10, clamp 72 may be positioned at original position 100 with respect to fixed member 94 and pushing member 96 may be positioned at original position 108 with respect to member 94. Display 14 may be attached to mandrel 34 in a substantially flat position (e.g., using adhesive layer 80 of FIG. 8). If desired, display 14 and mandrel 34 may include alignment marks 101A and 101B respectively for aligning display 14 to mandrel 34.

Mandrel 34 and attached display 14 may be pressed against member 94 so that curved surface 97 presses portions 14E of display 14 into position 114. While mandrel 34 and attached display 14 are pressed against member 94 and portion 14E is in position 114, pushing member 96 may be moved in direction 112 from position 108 to position 110, thereby pushing portion 14E of display 14 in to position 116 as indicated by arrow 118.

After pushing member 96 is in position 110 and portion 14E of display 14 is in position 116, clamp 72 may be moved in direction 106 from position 100 to position 102. Moving clamp 72 in direction 106 from position 100 to position 102 may press portion 14E of display 14 in to position 121 against the inner surface of mandrel 34 as indicated by arrow 119. While clamp 72 is in position 102 and portion 14E of display 14 is held by clamp 72 in position 121, fastening member 76 may be engaged in opening 74 of mandrel 34, thereby fastening bent edge portion 14E of display 14 in bent position 121 against mandrel 34.

In the example of FIG. 10, fastening member 76 is implemented as a screw having threads 122 for engaging with engagement features such as threading structures 120 in opening 74. However, this is merely illustrative. Fastening member 76 may be engaged in opening 74 using any suitable type of engagement feature.

Figure 11:
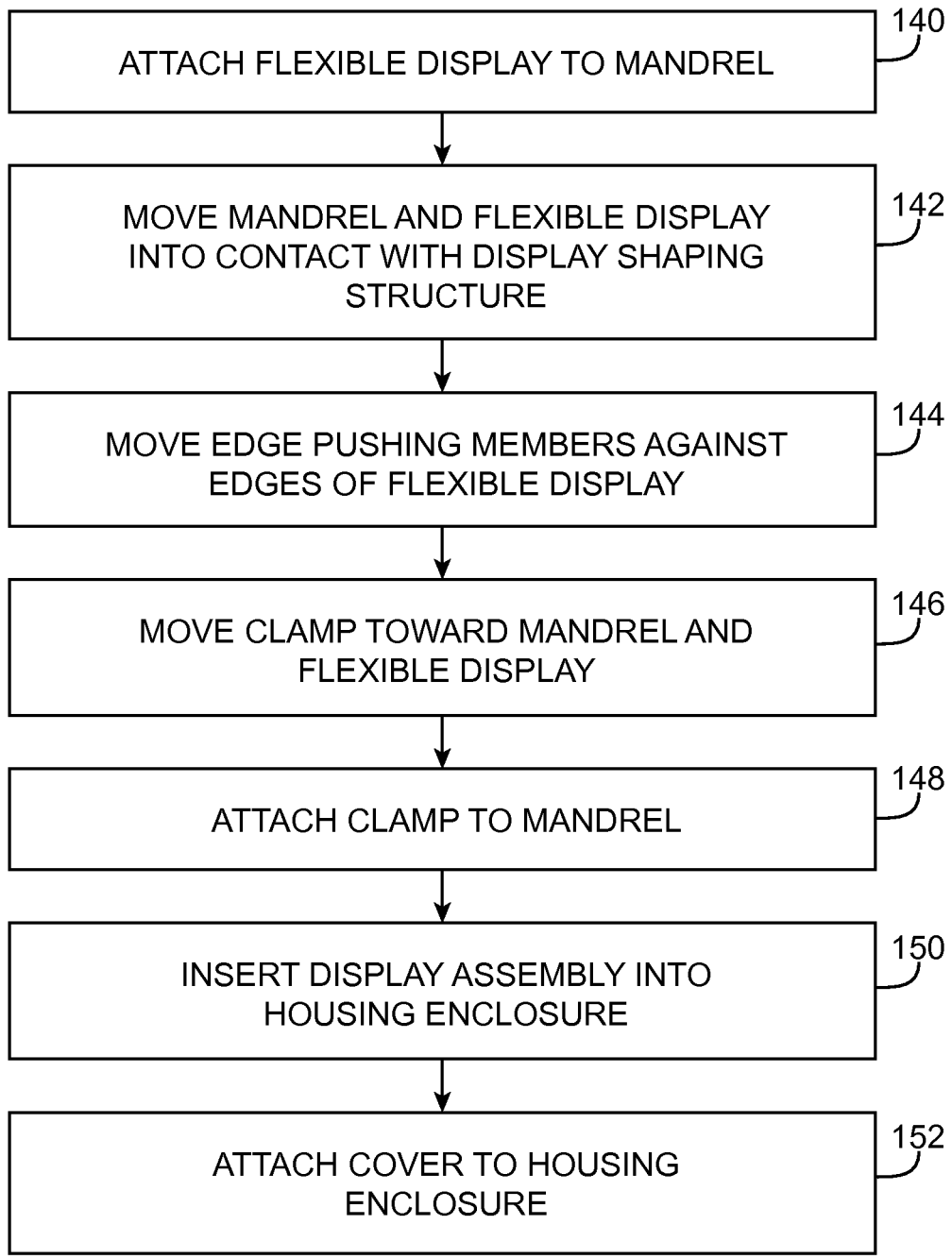
FIG. 11 is a flow chart of illustrative steps involved in fastening the bent edges of a flexible display to a support structure in accordance with an embodiment of the present invention.

Illustrative steps that may be used in assembling an electronic device such as device 10 having bent edge portions 14E that are fastened in bent position 121 against mandrel 34 are shown in FIG. 11.

At step 140, a flexible display such as an OLED display may be attached to a support structure such as a mandrel (e.g., using adhesive). If desired, alignment marks may be used to align the display with the mandrel.

At step 142, the mandrel and (attached) flexible display may be moved into contact with a fixed mounting member such as a display shaping structure. Moving the mandrel and flexible display into contact with the fixed mounting member may cause portions of the flexible display such as edge portions of the flexible display to be partially wrapped around the mandrel.

At step 144, pushing members such as edge pushing members may be moved against the (partially wrapped) edges of the flexible display. Moving the pushing members against the edge portions of the flexible display may cause the edge portions to be further wrapped into a position under a clamp that is to be used for fastening the edge portions to the mandrel.

At step 146, the clamp may be moved toward the mandrel and (attached) flexible display. Moving the clamp toward the mandrel and (attached) flexible display may press the edge portions of the flexible display against a surface of the mandrel.

At step 148, the clamp may be attached to the mandrel. The clamp may be attached to the mandrel using fastening members such as screws that engage in openings in the mandrel. The fastening members may, if desired, pass through openings in the edge portions of the flexible display.

At step 150, a display assembly having a mandrel, a clamp, and a flexible display with bent edge portions fastened to the mandrel using the clamp may be inserted into a housing enclosure for the electronic device. The housing enclosure may include one or more housing members. The mandrel and/or the clamp may include alignment structures such as openings for attachment members that help in aligning the display with the housing member. Inserting an assembled display assembly having a flexible display with fastened bent edges may help in assembling device 10 without placing unwanted stress on additional device components such as housing members.

At step 152, a display cover layer such as a cover glass layer may be attached to the housing enclosure over the display.

Figure 12:
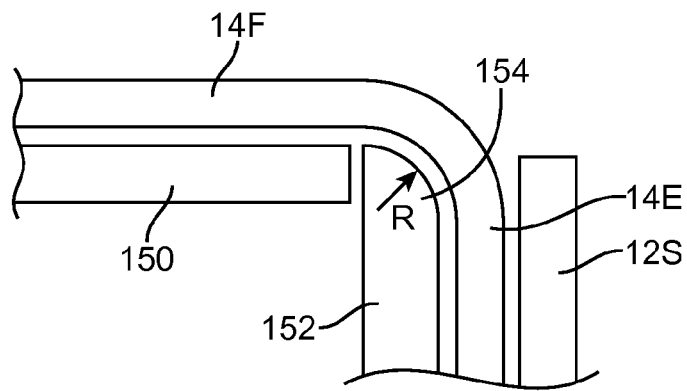
FIG. 12 is an illustrative diagram showing how a bent portion of a flexible display that is fastened between a housing member and an internal support member may conform to the shape of a curved portion of the internal support member and an additional planar support member in accordance with an embodiment of the present invention.

FIG. 12 shows how a bent portion such as bent portion 14E of flexible display 14 that is fastened between a housing member such as member 12S and an internal support member such as fastening support member 153 may conform to the shape of a curved portion of fastening support member 153. Curved portion 154 of member 153 may have a bend radius R. Display 14 may be wrapped around support members 151 and 153 so that bent edge portion 14E conforms to the shape of member 153 and planar support member 151. Member 153 may, for example, be a mandrel such as mandrel 34 (FIG. 4). Member 151 may, for example, be a carrier structure such as carrier 32.

Figure 13:
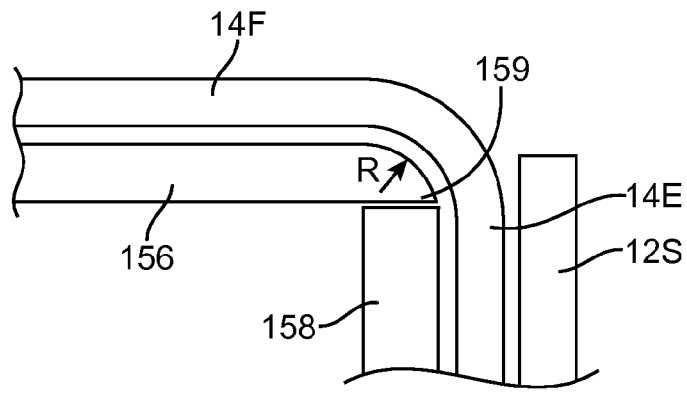
FIG. 13 is an illustrative diagram showing how a bent portion of a flexible display may be fastened between a housing member and multiple internal support members in accordance with an embodiment of the present invention

FIG. 13 shows how bent edge portion 14E of display 14 may be fastened between a housing member such as member 12S and two or more internal support members such as support members 156 and 158. In the example of FIG. 13, support member 156 and 158 meet at an interface formed along bent portion 14E of display 14. In this type of configuration, planar front portion 14F of display 14 may be attached to an internal support structure such as member 156 having a curved portion 159 with a bend radius R. Display 14 may be wrapped around support members 156 and 158 so that bent edge portion 14E conforms to the shape of member 156 and support member 158. Member 158 may, for example, be a mandrel such as mandrel 34 (FIG. 4). Member 156 may, for example, be a carrier structure such as carrier 32.

Figure 14:
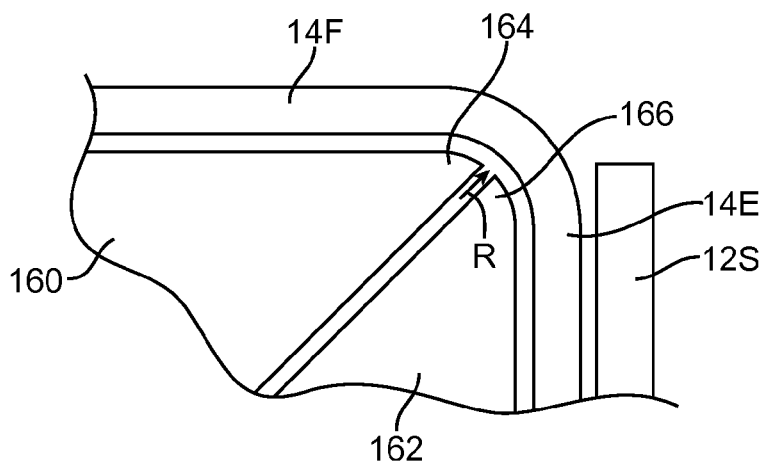
FIG. 14 is an illustrative diagram showing how a bent portion of a flexible display that is fastened between a housing member and an internal support member may conform to the shape of a curved portion of the internal support member and a curved portion of an additional support member in accordance with an embodiment of the present invention.

FIG. 14 shows how bent edge portion 14E of display 14 may be fastened between a housing member such as member 12S and an internal support member such as support member 162 that forms, in combination with an additional internal support member such as member 160, a surface having a bend radius R. Bent edge portion 14E may be wrapped around members 160 and 162 so that display 14 conforms to the surface of curved portion 164 of member 160 and curved portion 166 of member 162. Member 162 may, for example, be a mandrel such as mandrel 34 (FIG. 4). Member 160 may, for example, be a carrier structure such as carrier 32.

The foregoing is merely illustrative of the principles of this invention and various modifications can be made by those skilled in the art without departing from the scope and spirit of the invention.

What is claimed is:

1. An electronic device, comprising:
    an organic light-emitting diode display having an array of display pixels formed on a display substrate; and
    a mandrel having an edge, wherein a portion of the display substrate is wrapped around the edge of the mandrel.

2. The electronic device defined in claim 1 wherein the display substrate includes an active area in which the array of display pixels is formed and wherein the display substrate is curved in the active area.

3. The electronic device defined in claim 2 wherein the display substrate has a convex surface and wherein the array of display pixels is formed on the convex surface.

4. The electronic device defined in claim 2 wherein the portion of the display substrate that is wrapped around the edge of the mandrel extends behind the active area of the display substrate.

5. The electronic device defined in claim 4 wherein a portion of the mandrel is interposed between the active area of the display substrate and the portion of the display substrate that extends behind the active area of the display substrate.

6. The electronic device defined in claim 2 further comprising a glass cover layer having a curved surface.

7. The electronic device defined in claim 1 wherein the edge of the mandrel has a curved surface and wherein the display substrate bends around the curved surface.

8. The electronic device defined in claim 1 wherein the display substrate comprises a flexible sheet of polymer.

9. An electronic device, comprising:
    a display having a flexible substrate and an array of display pixels formed on a first portion of the flexible substrate;
    a support structure having a rounded edge, wherein a second portion of the flexible substrate curves around the rounded edge; and
    a housing in which the display and the support structure are mounted.

10. The electronic device defined in claim 9 wherein the support structure comprises opposing upper and lower surfaces, wherein the rounded edge joins the upper and lower surfaces, wherein the first portion of the flexible substrate is adjacent to the upper surface and wherein the second portion of the flexible substrate is adjacent to the lower surface.

11. The electronic device defined in claim 9 wherein the array of display pixels comprises an array of organic light-emitting diode pixels.

12. The electronic device 9 wherein the flexible substrate comprises a flexible sheet of polymer.

13. The electronic device defined in claim 9 wherein the first portion of the flexible substrate on which the array of display pixels is formed is curved.

14. The electronic device defined in claim 9 wherein the support structure comprises metal.

15. An electronic device, comprising:
    a flexible display having a bent edge portion;
    a curved transparent cover layer through which the flexible display emits light; and
    a mandrel having opposing upper and lower surfaces joined by a rounded edge, wherein the bent edge portion of the flexible display bends around the rounded edge from the upper surface to the lower surface of the mandrel.

16. The electronic device defined in claim 15 wherein the flexible display comprises a flexible organic light-emitting diode display having an array of organic light-emitting diode pixels.

17. The electronic device defined in claim 16 wherein the bent edge portion comprises conductive routing lines for routing display signals to the array of organic light-emitting diode pixels.

18. The electronic device defined in claim 16 wherein the array of organic light-emitting diode pixels is formed on a non-planar portion of the flexible display.

19. The electronic device defined in claim 15 further comprising an adhesive interposed between the flexible display and the mandrel.

* * * * *